(12) United States Patent
Sullivan et al.

(10) Patent No.: US 7,279,856 B1
(45) Date of Patent: Oct. 9, 2007

(54) ENVIRONMENTAL AND HEALTH MONITORING CIRCUITRY FOR STORAGE PROCESSOR I/O ANNEX MODULE

(75) Inventors: Douglas Sullivan, Hopkinton, MA (US); Stephen Strickland, Marlboro, MA (US); Michael J. Kozel, Upton, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/395,460

(22) Filed: Mar. 31, 2006

(51) Int. Cl.
*H02P 7/08* (2006.01)

(52) U.S. Cl. .................. 318/66; 318/560; 318/568; 307/64; 701/301; 701/306; 361/30

(58) Field of Classification Search .............. 318/66, 318/560, 466, 568; 307/64, 80; 361/30, 361/42, 65; 701/301, 305, 316
See application file for complete search history.

(56) References Cited

U.S. PATENT DOCUMENTS

| | | | |
|---|---|---|---|
| 5,747,889 A * | 5/1998 | Raynham et al. ............ 307/80 |
| 6,738,857 B2 * | 5/2004 | Sanders et al. ............. 710/316 |
| 2003/0041204 A1 * | 2/2003 | Sanders et al. ............. 710/301 |
| 2003/0111909 A1 * | 6/2003 | Liu et al. ..................... 307/64 |
| 2003/0112647 A1 * | 6/2003 | Liu et al. ..................... 363/144 |
| 2005/0180181 A1 * | 8/2005 | Gaudreau et al. ............ 363/71 |
| 2007/0052296 A1 * | 3/2007 | Gaudreau et al. ............ 307/82 |

* cited by examiner

*Primary Examiner*—Paul Ip
(74) *Attorney, Agent, or Firm*—BainwoodHuang (57) ABSTRACT

A hot-pluggable I/O annex module of a storage processor assembly includes interface circuitry providing connections to an optional I/O interface module. The I/O annex module includes redundant cooling fans providing cooling airflow to an I/O annex mounting area, main power conversion circuitry for generating main operating power for the interface circuitry, auxiliary power conversion circuitry for generating auxiliary power, a controller for monitoring and controlling the operation of cooling fans; and monitoring circuitry powered by the auxiliary power for monitoring correct operation of the controller and, upon detecting incorrect operation, disabling the main power conversion circuitry. The monitoring circuitry includes a watchdog timer and a latch collectively operative to (i) determine if a controller status signal indicating correct operation of the controller does not toggle for a watch interval, and if so then (ii) enter an operating state in which the main power conversion circuitry is disabled and cannot be re-enabled except by cycling the primary power or removing and reinserting the I/O annex module to/from the storage processor assembly.

16 Claims, 7 Drawing Sheets

ENVIRONMENTAL AND HEALTH MONITORING CIRCUITRY FOR STORAGE PROCESSOR I/O ANNEX MODULE

BACKGROUND

The invention pertains to the field of data storage systems.

In the field of data storage systems, it is known to utilize an arrangement in which a storage processor is implemented in a self-contained assembly, such as a rack-mountable enclosure, and storage elements such as disk drives are packaged in additional assemblies and coupled to the storage processor by high-speed storage buses, such as Small Computer System Interconnect (SCSI) or Fibre Channel buses. Similar high-speed buses are used to interconnect the storage processor with one or more host computers that utilize the storage resources provided by the storage system during operation. This arrangement can be beneficial for storage installations in which some degree of growth of storage requirements is expected. A customer may purchase an initial system including a storage processor assembly and one or more disk drive assemblies, and purchase additional disk drive assemblies as the customer's storage needs grow. Much of the specialized functionality related to controlling the operation of the storage system is concentrated in the storage processor assembly, while somewhat lower-level operations of specific data storage operations are performed in lower-cost circuitry that may be replicated within each disk drive assembly.

SUMMARY

In some storage systems it may be desirable to provide expansion capability within a storage processor assembly itself. Beyond the interface circuitry that is utilized to interface to the high-speed storage buses, there may be a desire to include interface circuitry for a more specialized use. For example, it may be desired that a storage processor having interfaces to standard storage buses such as SCSI or Fibre Channel buses also have an interface to a "host bus adapter" so as to be usable as "direct-attached" storage in some operating environments. Moreover, it may be desirable that any such specialized interfaces be strictly optional from a product perspective, so that customers not having such special requirements do not incur the costs of such specialized interfaces.

Again from a product perspective, it may be desirable not only that any specialized functional interface circuitry be optional, but also that any supporting components be added to a storage system only as needed when the optional interfaces are being utilized, rather than burdening all uses or installations of the storage system with the supporting components. Typical examples of such components include power supplies and cooling fans, for example, along with corresponding environmental monitoring and protection circuitry. In many systems, it is common to design the core system assembly to include power circuitry and fans sufficient for a maximum configuration which includes any/all optional interfaces. In such cases, any installations having less than the maximum configuration are essentially wasting the additional power and cooling capacity, which have been paid for by the customer. It may be desirable instead to incorporate such components into a system in a more incremental fashion in proportion to the use of optional interface circuitry for example.

In accordance with the present invention, a hot-pluggable I/O annex module is disclosed that may be used in a storage processor assembly, wherein the storage processor assembly includes (i) a power source operative to generate primary power, (ii) a partition between a storage processor mounting area in which a storage processor is to be mounted and an I/O annex mounting area in which the I/O annex module is to be mounted, and (iii) at least one main cooling fan powered by the primary power and located adjacent to the storage processor mounting area to provide cooling airflow. The I/O annex module includes interface circuitry to be connected to the storage processor module, the interface circuitry being operative to provide a connection between the storage processor module and an optional I/O interface module, such as an I/O interface module functioning as a host bus adapter. The optional I/O interface module includes several of its own power, cooling and monitoring components, such as (1) redundant I/O annex cooling fans that provide a cooling airflow to the I/O annex mounting area, (2) main power conversion circuitry that converts the primary power from the power source into main operating power for the interface circuitry, (3) auxiliary power conversion circuitry that converts the primary power from the power source into auxiliary power; (4) a controller operative to monitor and control the operation of the I/O annex cooling fans; and (5) monitoring circuitry powered by the auxiliary power, the monitoring circuitry being operative to monitor correct operation of the controller and, upon detecting incorrect operation, to disable the main power conversion circuitry.

During operation, initially upon insertion of the I/O annex module during powered operation of the storage processor assembly, a module power-good indication is forced to a deasserted state irrespective of regulator power-good indications generated by respective power regulators of the I/O annex module. The module power-good indication is provided to a storage processor of the storage processor assembly responsible for functionally incorporating or including the I/O annex module into the operation of the storage processor assembly based at least in part on whether the I/O annex module attains a power-good status as indicated by the module power-good indication. Also, the I/O annex module performs a self-test which includes monitoring tachometer signals from respective fans of the I/O annex module, the tachometer signals indicating whether the fans are operating correctly. In the event that the tachometer signals indicate that at least one of the fans is operating correctly, then the module power-good indication is freed to a state determined by the regulator power-good indications. During subsequent operation of the I/O annex module, the monitoring of the tachometer signals from the respective fans of the I/O annex module continues, and in the event that the tachometer signals indicate that none of the fans is operating correctly the module power-good indication is deasserted The monitoring circuitry may include a watchdog timer and a latch that co-operate to (i) determine if a controller status signal indicating correct operation of the controller does not toggle for a watch interval, and if so then (ii) enter an operating state in which the main power conversion circuitry is disabled and cannot be re-enabled except by cycling the primary power or removing and reinserting the I/O annex module to/from the storage processor assembly.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
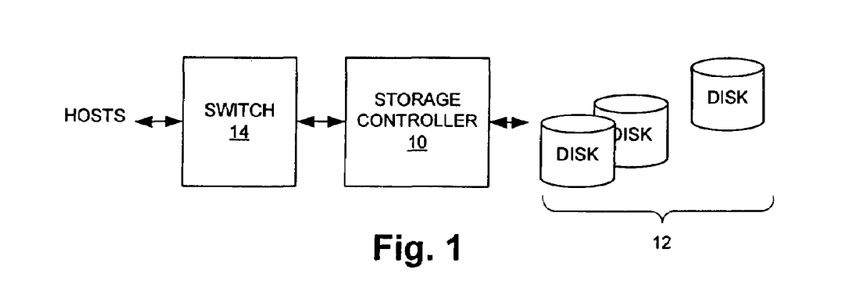
FIG. 1 is a block diagram of a data storage system in accordance with the present invention.

FIG. 1 shows a storage system including a storage controller 10 coupled to a plurality of disk drives (disks) 12. The controller is also coupled to host computers (hosts, not shown), via one or more switches 14. In operation, storage requests generated by the hosts are routed through the switch 14 to the storage controller 10, which satisfies the requests using the storage resources provided by the disks 12. The storage controller 10 may or may not implement semiconductor memory caching as temporary storage for data that resides on the disks 12. The configuration shown in FIG. 1 may be seen as a "storage area network" or SAN configuration. However, the storage controller 10 may also be used in other configurations, including directly attached to one or more hosts and attached to a network, the latter being referred to as "network attached storage" or NAS.

Figure 2:
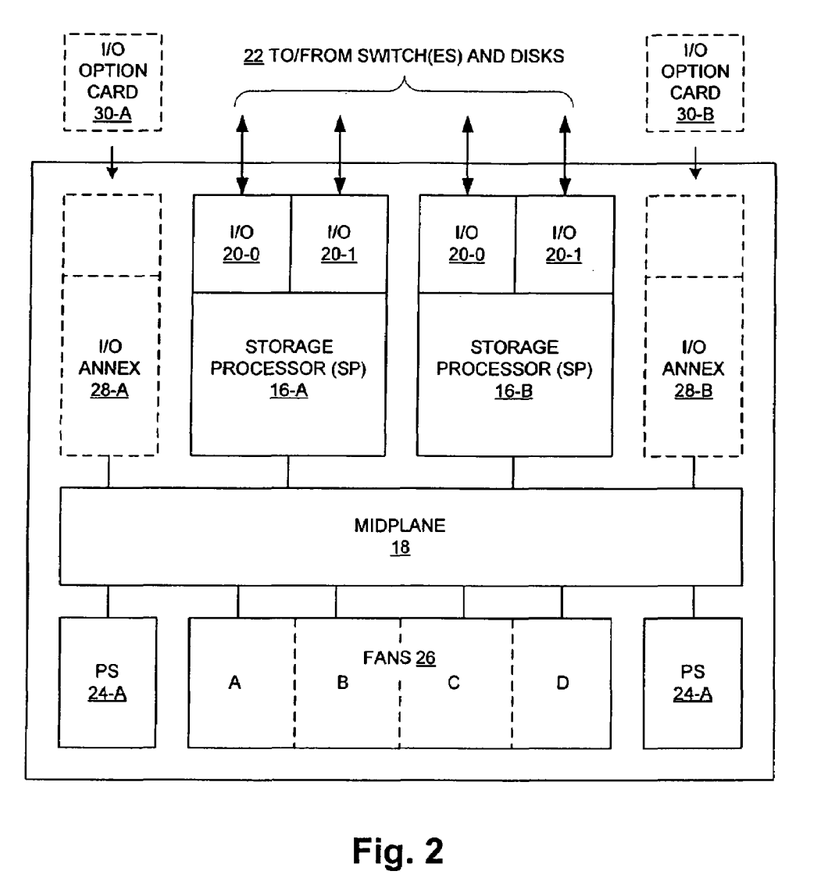
FIG. 2 is a block diagram of a storage controller in the data storage system of FIG. 1.

FIG. 2 shows a functional block diagram of the storage controller 10. A pair of storage processors (SPs) (shown as SP blades 16-A and 16-B) are connected to a midplane circuit board (midplane) 18. Each SP 16 has a respective pair of input/output (I/O) modules 20 (shown as I/O 20-0 and I/O 20-1) to which are connected to high-speed storage buses 22. The storage buses 22 provide connectivity to the disks 12 and switch 14 of FIG. 1. In one embodiment, I/O modules 20 of different types may be used in the storage controller 10. For example, I/O module 20-0 may provide multiple Gigabit-Ethernet (GbE) ports, either electrical (RJ45), optical, or both, and I/O module 20-1 may provide multiple Fibre channel (FC) optical ports. Each SP 16 includes high-bandwidth "data mover" hardware as well as a processor complex which together implement all the control and data-moving functionality required for processing storage requests. The SPs 16 may be configured as a redundant pair such that either can assume the processing workload of the other in the event one of the SPs 16 fails.

Also connected to the midplane 18 are a pair of power supplies 24 (shown as PSs 24-A and 24-B) and four blowers or fans 26. The PSs 24 and fans 26 may also be configured for redundancy, such that one PS 24 can handle the entire load of the storage controller 10 in the event that the other PS 24 fails. Likewise the fans 26 may be configured in a redundant manner, such as so-called "N+1" redundancy (with N=3 in this case). In the illustrated embodiment, only three operating fans 26 are required and one fan 26 is a spare that can be substituted for a failed fan 26.

Also connected to the midplane 18 are a pair of I/O annex modules 30 (shown as I/O annexes 28-A and 28-B). The I/O annex modules 30 are optional, as indicated by the broken line depiction. When present, each I/O annex module 30 provides an interface between the corresponding SP (e.g. SP 16-A for I/O annex 28-A) and an I/O option card 30 (shown as I/O option cards 30-A and 30-B). Overall, each I/O annex 28 provides a third I/O module for each SP 16 by providing a X8 PCI-Express "off the shelf" option card slot, similar to a Peripheral Component Interconnect (PCI) slot in a personal computer, enabling future expansion and/or feature capability as such cards come to market. An example of a PCI-Express I/O option card 30 is a PCI-Express module that functions as a host bus adapter (HBA), such as a iSCSI or 10-GbE adapter.

Figure 3:
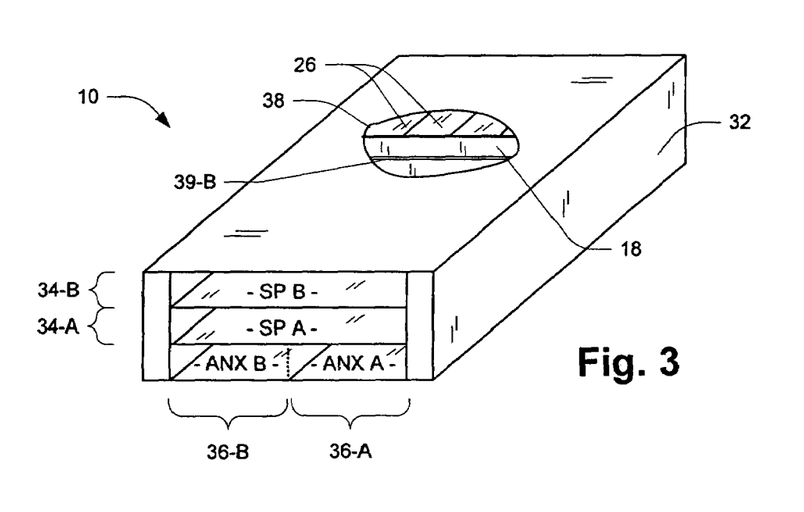
FIG. 3 is a perspective rear view of a physical embodiment of the storage controller of FIG. 2, referred to herein as a "storage processor assembly"

FIG. 3 is a rear perspective view of a physical packaging arrangement termed a "storage processor assembly" for the storage controller 10 of FIGS. 1-2. The various controller components are housed in a rack-mountable enclosure 32 of dimensions 19" wide, 4" high, and 30" deep. The enclosure is divided into three levels, one each for the two SPs 16 and one level for both the I/O annexes 28. Specifically, there are two SP mounting areas 34 (shown as 34-A and 34-B) and two I/O annex mounting areas 36 (shown as 36-A and 36-B). The SPs 16 are implemented as rectangular circuit modules or "blades" that are inserted/extracted by being slid into or out of the respective mounting area 34.

As shown by a cutaway 38, the midplane 18 extends across the interior of the enclosure 32 approximately ⅔ of the way forward. An electrical connector 39-A that provides connections between the midplane 18 and the SP 16-A is visible through the cutaway 38. Also visible are the fans 26. Although not shown in FIG. 3, the midplane 18 is configured by shape and inclusion of openings to permit a large rearward airflow from the fans 26 through the SP mounting areas 34 to cool the SPs 16 during operation. The I/O annex mounting areas 36 are cooled separately as described below.

Figure 4:
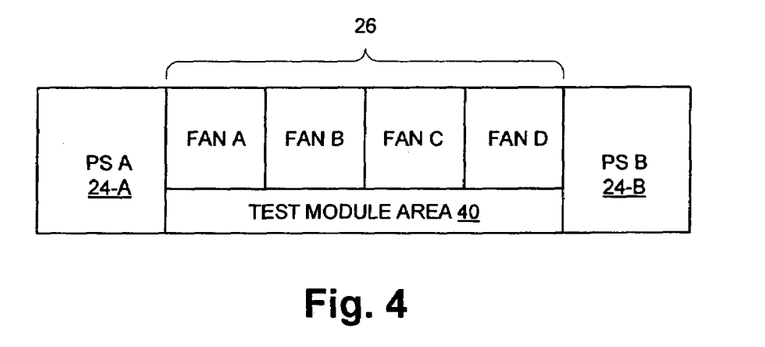
FIG. 4 is a front view of the storage processor assembly of FIG. 3.

FIG. 4 shows a front view of the enclosure 32. Physically, the PSs 24 are mounted at opposite sides with the fans 26 therebetween. The fans 26 extend only about ⅔ of the way down from the top of the enclosure 32, vertically co-extensive with the two SP mounting areas 34. The bottom ⅓ is a test module mounting area 40 into which a test module can be inserted for testing during the manufacturing process. During normal operation the test module area 40 is empty and covered by a panel (not shown) that permits airflow into the test module area 40 and, continuing further rearward, the I/O annex mounting areas 36.

Figure 5:
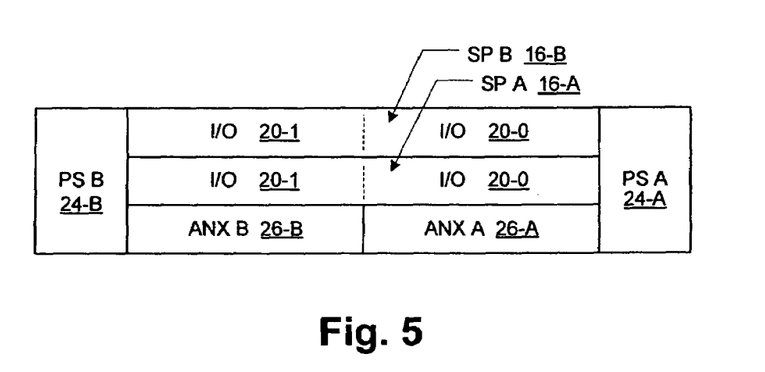
FIG. 5 is a rear view of the storage processor assembly of FIG. 3.

FIG. 5 is a rear view of the enclosure 32 with the SPs 16 and I/O annexes 26 installed. Each I/O module 20 has a respective rear-facing bulkhead on which are mounted the electrical and/or optical connectors (not shown) for the respective buses 22. Likewise there is a rear-facing bulkhead of each I/O annex 26 on which connectors are mounted for the bus(es) that the corresponding I/O option card 30 interfaces to.

Figure 6:
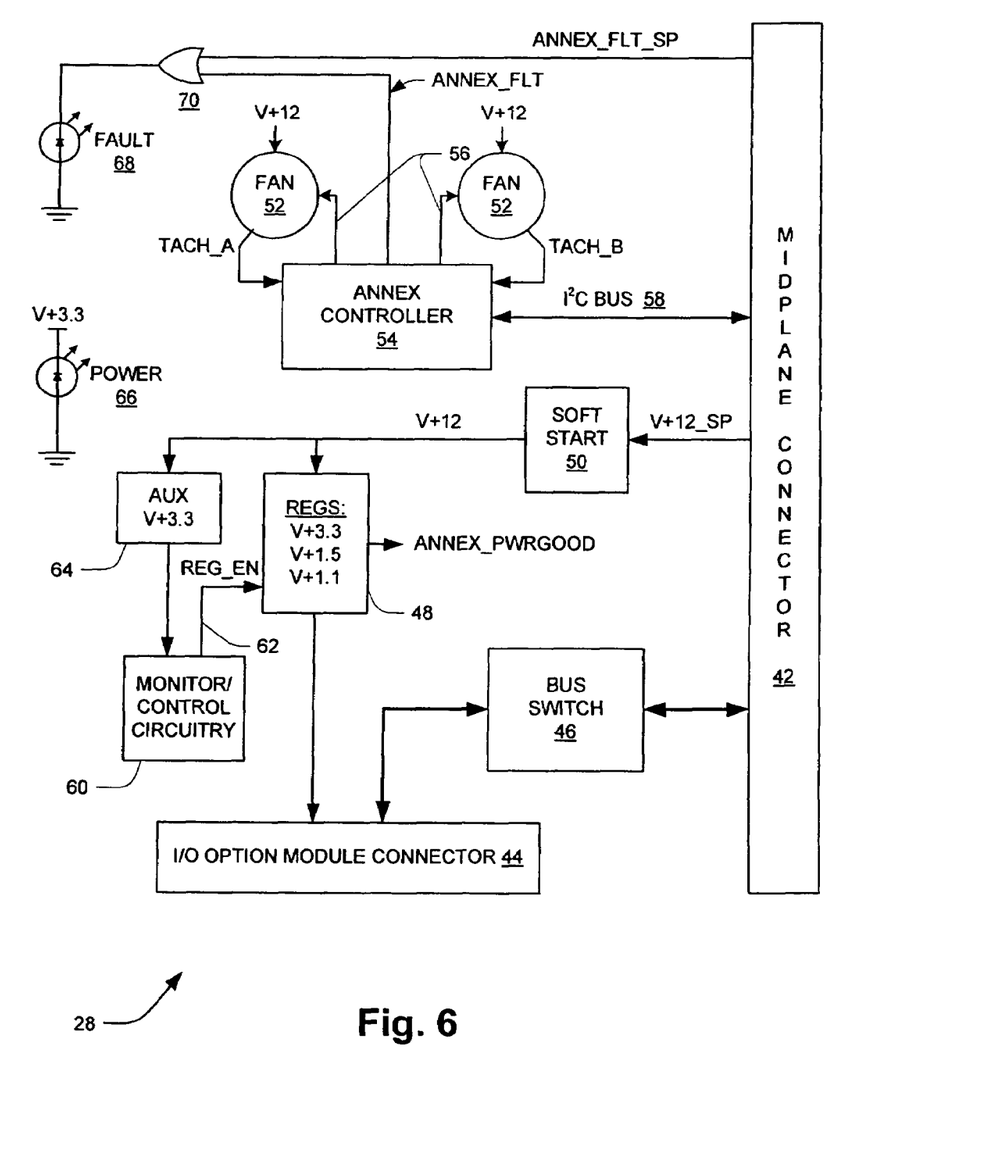
FIG. 6 is a block diagram of an input/output (I/O) annex module in the storage controller of FIG. 2.

FIG. 6 is a block diagram of an I/O annex module 28. It includes respective connectors 42 and 44 for the midplane 18 and I/O option card 30. A bus switch 46 provides for a programmable interconnection between an internal PCI bus of the storage controller 10 (appearing on the midplane 18) and an external PCI bus defined on the connector 44 and the I/O option card 44. The I/O annex module 28 also includes a set of power regulators (REGS) 48 that generate main operating voltages of +3.3, +1.5 and +1.1 (shown as V+3.3, V+1.5 and V+1.1 respectively) from an operating voltage of +12 (V+12), which in turn is generated by a soft-start circuit 50 from a voltage of +12 (V+12_SP) provided by a power supply 24 (FIG. 2) via the midplane 18. The soft-start circuit 50 permits hot-plugging of the I/O annex module 28. The bus switch 46 receives its operating power from the V+1.5 regulator.

The I/O annex module 28 also includes a pair of fans 52 that provide the airflow for cooling the I/O annex module 28 during operation. An annex controller 54 is used to control and monitor fan operation. The annex controller 54 is part of a feedback control loop that includes respective tachometer signals TACH_A and TACH_B from the fans 52 and pulse-width-modulated control signals 56. The annex controller 54 is also used to monitor and control other aspects of the operation of the I/O annex module 28 as described below. The annex controller 54 communicates with the corresponding SP 16 via an Inter-IC (I²C) bus 58.

Additional circuitry includes dedicated monitoring and control (monitor/control) circuitry 60 which provides a regulator enable (REG_EN) signal 62 to the power regulators 48 to enable their operation. The monitor/control circuitry 60 is powered by an auxiliary +3.3 volt power converter circuit (AUX) 64 powered directly from V+12. A Power indicator (LED) 66 is powered from V+3.3 to indicate when the I/O annex module 28 has power. A Fault indicator (LED) 68 is used to indicate the presence of a fault condition. By action of an OR circuit 70, the Fault LED 68 can be activated by an external fault signal ANNEX_FLT_SP from the corresponding SP 16 via the midplane 18, or by a local fault signal ANNEX_FLT generated by the annex controller 54.

Figure 7:
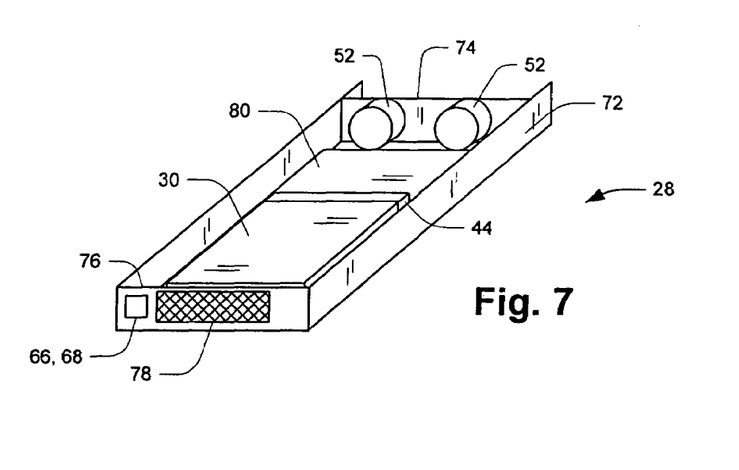
FIG. 7 is a perspective view of a physical embodiment of the I/O annex module of FIG. 6 suitable for use with the storage processor assembly of FIG. 3.

FIG. 7 shows a physical arrangement for the I/O annex module 28. It includes a tray-like housing 72. The fans 52 are mounted on a front-facing bulkhead 74, and a rear-facing bulkhead 76 includes openings 78 for airflow as well as the dual stacked LEDs 66 and 68. Mounted within the housing 72 is an I/O annex circuit card 80 which includes most of the circuitry of FIG. 6, including the I/O option module connector 44 into which the I/O option card 30 is mounted.

It will be appreciated that during operation, the fans 52 generate a cooling rearward airflow over the I/O annex circuit card 80 and I/O option card 30 and exiting through the openings 78. In addition to providing its own cooling in this fashion, the I/O annex module 28 also provides other self-operating and self-monitoring functions as described in more detail below.

Figure 8:
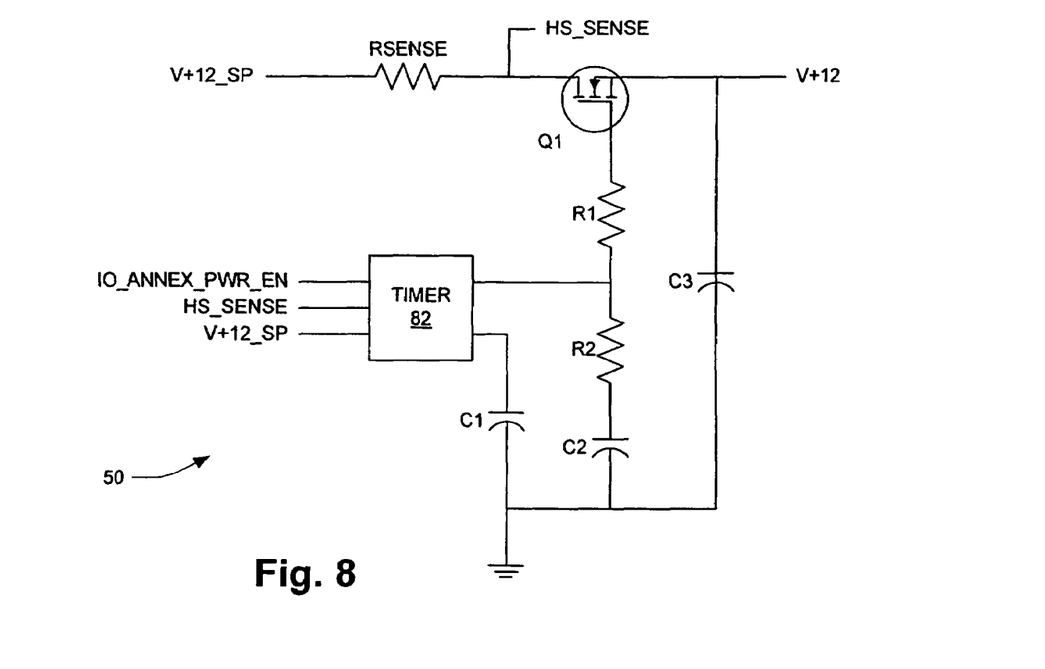
FIG. 8 is a schematic diagram of a soft start circuit in the I/O annex module of FIG. 6.

FIG. 8 shows the soft-start circuit 50 of FIG. 6. The soft start circuit 50 controls the inrush of primary power from the power supply 24 upon insertion of the I/O annex module 28 into the storage processor assembly, thereby avoiding a disturbance of the primary power during hot-plugging of the I/O annex module 28. It includes a power FET switch Q1 and a timer 82 to smoothly transition the FET switch Q1 from a full-OFF state to a full-ON state. The timer 82 receives its operating power from V+12_SP. It also receives a signal IO_ANNEX_PWR_EN provided by the corresponding SP 16 via the midplane 18, and a sense signal HS_SENSE that is developed by a sense resistor RSENSE. The timer 82 utilizes a time constant of approximately one microsecond which is established by resistor R2 and capacitor. Capacitor C3 serves as a bulk decoupling capacitor for V+12.

Figure 9:
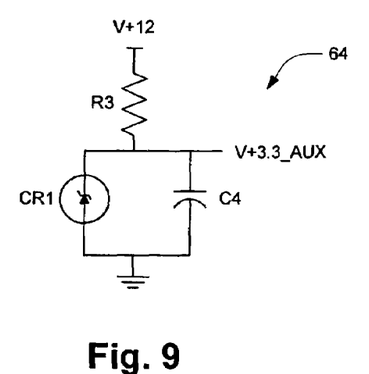
FIG. 9 is a schematic diagram of an auxiliary power converter circuit in the I/O annex module of FIG. 6.

FIG. 9 shows the auxiliary +3.3 volt converter circuit 64. It consists of a 3.3-volt Zener diode CR1, capacitor C4 and resistor R3. This simple circuit is sufficient to adequately power the few components of the monitor/control circuitry 60 of FIG. 6, as described in more detail below.

Figure 10:
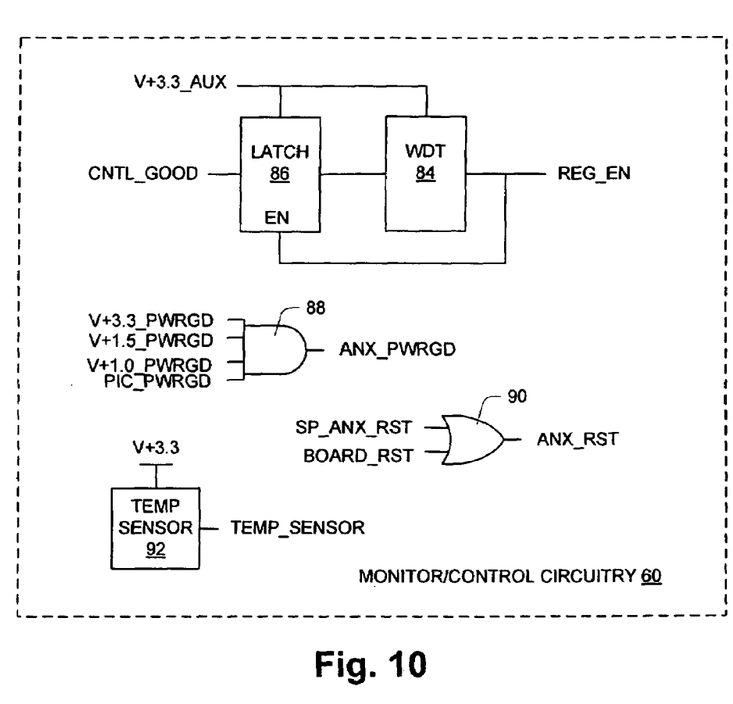
FIG. 10 is a schematic diagram of monitoring circuitry in the I/O annex module of FIG. 6.

FIG. 10 shows the monitor/control circuitry 60. A combination of a "watchdog" timer (WDT) 84 and a latch 86 are used to generate the regulator enable signal REG_EN based on the operational status of the annex controller 54 (FIG. 6) as reflected in a signal CNTL_GOOD generated by the annex controller 54. This circuit is powered by the auxiliary voltage V+3.3_AUX and operates as follows. The annex controller 54 toggles the signal CNTL_GOOD during its operation and thus if the annex controller 54 stops functioning correctly then the signal CNTL_GOOD stops toggling. The latch 86 is normally open so that the signal CNTL_GOOD is passed to the input of the WDT 84, which is reset whenever the signal CNTL_GOOD changes state. If CNTL_GOOD stops toggling, then the WDT timer "trips" (i.e., completes a timing cycle without being reset) and the signal REG_EN becomes deasserted. This has the dual effect of (1) disabling operation of the regulators 48 and therefore essentially all the other circuitry on the I/O annex module 28, and (2) closing the latch 86.

The purpose of the latch 86 is to make sure the input state of the WDT 84 does not change once it has tripped so that the power to the I/O annex module 28 is not inadvertently re-applied. This could occur, for example, if the annex controller 54 failed with the CNTL_GOOD signal asserted. When the WDT 84 trips and removes the power to the I/O annex module 28, then the signal CNTL_GOOD becomes deasserted (due to the removal of power), and this transition from asserted to deasserted could cause an inadvertent reset of the WDT 84. By employing the latch 84, the state of the input to the WDT 84 is locked and therefore the power to the I/O annex module 28 remains off. The CNTL_GOOD signal should never go high again because the annex controller 54 has no power, and therefore the I/O annex module 28 remains in the powered-off state until either the V+12_SP is cycled or the I/O annex module 28 is removed and reinserted . . .

Also included in the monitor/control circuitry are an AND circuit 88, an OR circuit 90 and a temperature sensor (TEMP SENSOR) 92, which may be physically located before the fans 52 next to the midplane 18 (FIG. 3) to monitor incoming air temperature. If the incoming air temperature rises to 30° C., the fans speed up to compensate for the higher temperature. If the incoming air temperature rises to 60° C., the annex controller 54 recognizes this as an over-temperature condition and de-asserts PIC_PWRGD to shut down the regulators 48 to prevent overheating and damage.

The AND circuit 88 receives "power good" signals from the V+3.3, V+1.5, and V+1.0 regulators 48, each signal indicating that the respective regulator is functioning properly. It also receives a power good signal PIC_PWRGD from the annex controller 54. The output of the AND circuit 88 is a signal ANX_PWRGD that is provided to the corresponding SP 16 via the midplane 18, indicating whether the I/O annex module 28 has correct operating power. The SP 16 monitors the ANX_PWRGD signal to determine whether there is a power-related fault condition on the I/O annex module 28. The PIC_PWRGD input to the AND circuit 88 enables the annex controller 54 to override "good" indications from the regulators 48, which may be used for example during initial operation to prevent addition of the I/O annex module 28 to the controller 10 until self-test has passed and proper operation of the fans 52 has been confirmed.

The OR circuit 90 is used to generate a signal ANX_RST that resets the operational circuitry of the I/O annex module 28 as well as any I/O option card 30 installed therein. One input is the signal SP_ANX_RST from a corresponding SP 16 via the midplane 18. The other input is a signal BOARD_RST generated by the annex controller 54. By use of the PIC_PWRGD and BOARD_RST signals, the annex controller 54 can control the assertion of the signals ANX_PWRGD and ANX_RST so as to independently control whether/how the I/O annex module 28 becomes functional within the storage controller 10 (also referred to as being "added" or "included" in the storage controller 10). The annex controller 54 wields this control in response to its own independent monitoring of the health of the I/O annex module 28.

Figure 11:
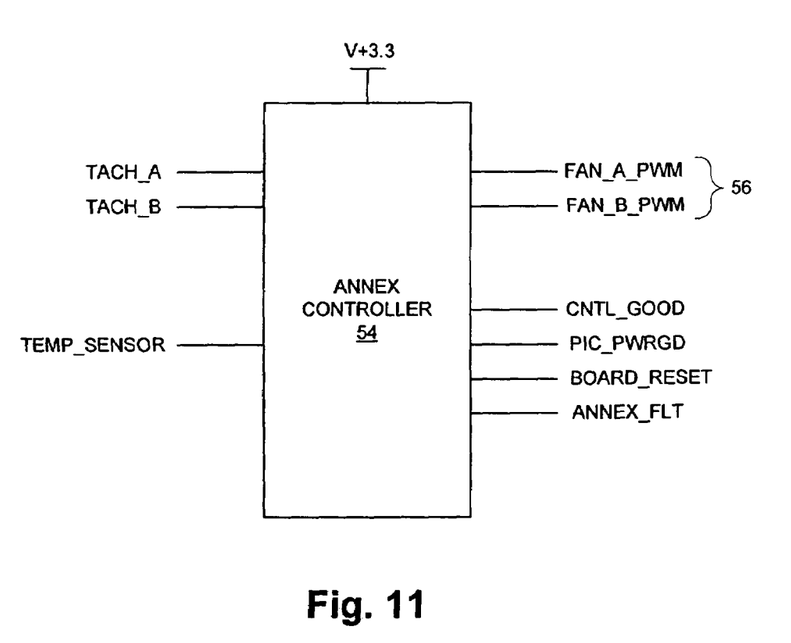
FIG. 11 is a schematic diagram showing interconnections to a controller in the I/O annex module of FIG. 6.

FIG. 11 illustrates various signals provided to or generated by the annex controller 54. The annex controller 54 receives the signals TACH_A and TACH_B generated by the fans 52. During normal operation, each of these signals includes regularly spaced pulses at a frequency proportional to the rotational speed of the corresponding fan 52. The controller uses the TACH_A and TACH_B signals (1) as feedback signals in a control loop that regulates fan speed, and (2) to monitor whether the fans 52 are operating at all. The FAN_A_PWM and FAN_B_PWM signals are the PWM control signals 56 for the fans 52. The annex controller 54 also receives the TEMP_SENSOR signal to detect any over-temperature condition that may develop, and generates the signals CNTL_GOOD, PIC_PWRGD, BOARD_RESET, and ANNEX_FLT.

In operation, if both of the fans 52 fail then the annex controller 52 drives the PIC_PWRGD signal low to cause the associated SP 16 to remove the I/O annex module 28 from the system. This is a "fail-safe" setup, as the SP 16 thinks there is a power problem when what has really occurred is that both fans 52 have failed. However, this situation should in practice almost never occur. Any failure of a single fan 52 can be reported over the I²C bus 58 and normally the I/O annex module 28 will be replaced before the second fan 52 fails.

Figure 12:
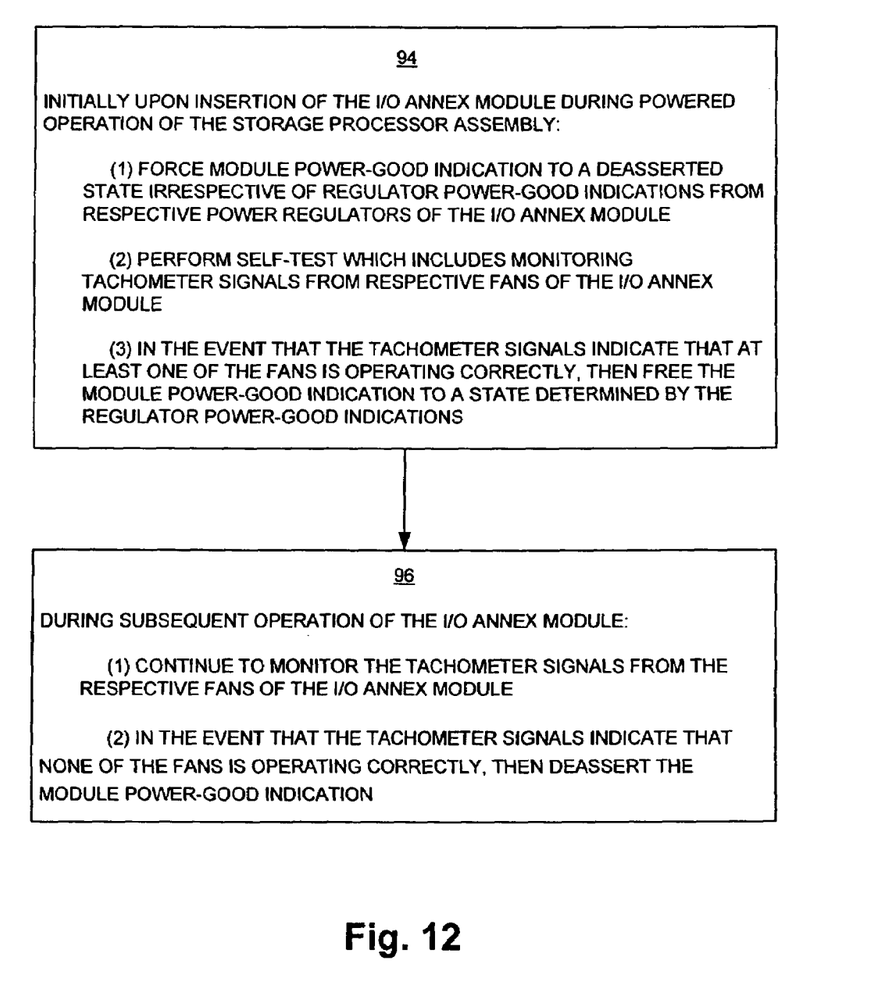
FIG. 12 is a flow diagram depicting aspects of operation of the I/O annex module of FIG. 6.

FIG. 12 illustrates the method of operation of an I/O annex module 28 with respect to fault monitoring. In step 94, initially upon insertion of the I/O annex module 28 during powered operation of the storage controller 10, the following occurs:

1. The module power-good indication ANX_PWRGD is forced to a deasserted state by deassertion of PIC_PWRGD from the annex controller 54. It will be noted that ANX_PWRGD will be deasserted irrespective of the regulator power-good indications (V+3.3_PWRGD, V+1.5_PWRGD, V+1.0_PWRGD) from the power regulators 48. The module power-good indication ANX_PWRGD is provided to the corresponding storage processor 16 which is responsible for functionally incorporating the I/O annex module 28 into the operation of the storage controller 10 at least in part on whether the I/O annex module 28 attains a power-good status as indicated by ANX_PWRGD.

2. The annex controller 54 performs a self-test which includes monitoring the tachometer signals TACH_A and TACH_B from the respective fans 52 of the I/O annex module 28, the tachometer signals indicating whether the fans 62 are operating correctly.

3. In the event that the tachometer signals indicate that at least one of the fans 52 is operating correctly, then the module power-good indication ANX_PWRGD is freed (by assertion of PIC_PWRGD) to a state determined by the regulator power-good indications.

At step 96, during subsequent operation of the I/O annex module 28, the following 1. The tachometer signals from the respective fans 52 continue to be monitored.

2. In the event that the tachometer signals indicate that neither of the fans 52 is operating correctly, then the module power-good indication ANX_PWRGD is deasserted.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A hot-pluggable I/O annex module for use in a storage processor assembly, the storage processor assembly including (i) a power source operative to generate primary power, (ii) a partition between a storage processor mounting area having a storage processor module mounted therein and an I/O annex mounting area in which the I/O annex module is to be mounted, and (iii) at least one main cooling fan powered by the primary power and located adjacent to the storage processor mounting area to provide cooling airflow thereto, the I/O annex module comprising:

interface circuitry to be connected to the storage processor module, the interface circuitry being operative to provide a connection between the storage processor module and an optional I/O interface module;

redundant I/O annex cooling fans operative to provide a cooling airflow to the I/O annex mounting area;

main power conversion circuitry operative to convert the primary power from the power source into main operating power for the interface circuitry;

auxiliary power conversion circuitry operative to convert the primary power from the power source into auxiliary power;

a controller operative to monitor and control the operation of the I/O annex cooling fans; and monitoring circuitry powered by the auxiliary power, the monitoring circuitry being operative to monitor correct operation of the controller and, upon detecting incorrect operation, to disable the main power conversion circuitry.

2. An I/O annex module according to claim 1, wherein the monitoring circuitry comprises a watchdog timer and a latch collectively operative to (i) determine if a controller status signal indicating correct operation of the controller does not toggle for a watch interval, and if so then (ii) enter an operating state in which the main power conversion circuitry is disabled and cannot be re-enabled except by cycling the primary power or removing and reinserting the I/O annex module to/from the storage processor assembly.

3. An I/O annex module according to claim 1, wherein the controller is operative (i) to control the speed of operation of the I/O annex cooling fans, and (ii) to generate a power good signal based on the status of respective tachometer signals from the I/O annex cooling fans, the power good signal becoming deasserted when the tachometer signals indicate that both of the I/O annex cooling fan have failed.

4. An I/O annex module according to claim 1, wherein the interface circuitry comprises an option module connector and a bus switch operatively coupled between the option module connector and a system connector of the I/O annex module.

5. An I/O annex module according to claim 1, wherein the main power conversion circuitry includes soft start circuitry operative to control the inrush of primary power from the power source upon insertion of the I/O annex module into the storage processor assembly and thereby avoid a disturbance of the primary power.

6. An I/O annex module according to claim 1, wherein the monitoring circuitry includes a temperature sensor operative to sense the temperature of incoming air to the I/O annex module so as to avoid operation of the I/O annex module in an over-temperature condition.

7. An I/O annex module according to claim 1, wherein the auxiliary power conversion circuitry is connected between a primary power node and a ground node and consists essentially of a resistor, a Zener diode in series with the resistor, and a capacitor in parallel with the Zener diode, the auxiliary power being generated at the connection between the resistor and the Zener diode.

8. A storage processor assembly, comprising:
a power source operative to generate primary power;
a partition between a storage processor mounting area and an I/O annex mounting area;
a main cooling fan powered by the primary power and located adjacent to the storage processor mounting area to provide cooling airflow thereto;
a storage processor module mounted in the storage processor mounting area, the storage processor receiving primary power from the power supplies and receiving cooling airflow from the main cooling fan; and
a hot-pluggable I/O annex module mounted in the I/O annex mounting area, the I/O annex module including:
interface circuitry connected to the storage processor module, the interface circuitry being operative to provide a connection between the storage processor module and an optional I/O interface module;
redundant I/O annex cooling fans operative to provide a cooling airflow to the I/O annex mounting area;
main power conversion circuitry operative to convert the primary power from the power source into main operating power for the interface circuitry;
auxiliary power conversion circuitry operative to convert the primary power from the power supplies into auxiliary power;
a controller operative to monitor and control the operation of the I/O annex cooling fans; and
monitoring circuitry powered by the auxiliary power, the monitoring circuitry being operative to monitor correct operation of the controller and, upon detecting incorrect operation, to disable the main power conversion circuitry.

9. A storage processor assembly according to claim 8, wherein the power source comprises redundant power supplies and the main cooling fan is one of multiple redundant main cooling fans.

10. A storage processor assembly according to claim 8, housed in an elongated housing and having a transverse midplane, and wherein the main cooling fans are located to one side of the midplane, and the storage processor and I/O annex module are located to the other side of the midplane.

11. A method of operating an I/O annex module of a storage processor assembly, comprising:
initially upon insertion of the I/O annex module during powered operation of the storage processor assembly, (1) forcing a module power-good indication to a deasserted state irrespective of regulator power-good indications from respective power regulators of the I/O annex module, the module power-good indication being provided to a storage processor of the storage processor assembly responsible for functionally incorporating the I/O annex module into the operation of the storage processor assembly based at least in part on whether the I/O annex module attains a power-good status as indicated by the module power-good indication, (2) performing a self-test which includes monitoring tachometer signals from respective fans of the I/O annex module, the tachometer signals indicating whether the fans are operating correctly, and (3) in the event that the tachometer signals indicate that at least one of the fans is operating correctly, then freeing the module power-good indication to a state determined by the regulator power-good indications; and
during subsequent operation of the I/O annex module in the storage processor assembly, (1) continuing to monitor the tachometer signals from the respective fans of the I/O annex module, and (2) in the event that the tachometer signals indicate that none of the fans is operating correctly, then deasserting the module power-good indication.

12. A method according to claim 11, wherein the I/O annex module includes a controller that monitors the tachometer signals.

13. A method according to claim 12, wherein the I/O annex module includes (i) auxiliary power conversion circuitry in addition to the power regulators, and wherein (ii) monitoring circuitry receiving operating power from the auxiliary power conversion circuitry, the monitoring circuitry monitoring the correct operation of the controller and, in the event of detecting a failure of the controller, disabling the power regulators of the I/O annex module.

14. A method according to claim 11, further comprising monitoring an operating temperature of the I/O annex module to avoid operation of the I/O annex module in an over-temperature condition.

15. A method according to claim 11, further comprising controlling the inrush of power upon insertion of the I/O annex module into the storage processor assembly and thereby avoid a disturbance of primary power utilized in the storage processor assembly.

16. A method according to claim 11, further comprising controlling the speed of each of the fans of the I/O annex module by pulse-width-modulated signals from a controller, the fans and controller being configured such that each fan operates at full speed by default if the controller fails.

* * * * *